US006653575B2

(12) United States Patent
Armezzani et al.

(10) Patent No.: US 6,653,575 B2
(45) Date of Patent: Nov. 25, 2003

(54) ELECTRONIC PACKAGE WITH STACKED CONNECTIONS AND METHOD FOR MAKING SAME

(75) Inventors: Gregg J. Armezzani, Endwell, NY (US); Matthew A. Heller, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 199 days.

(21) Appl. No.: 09/764,467

(22) Filed: Jan. 17, 2001

(65) Prior Publication Data

US 2001/0001593 A1 May 24, 2001

Related U.S. Application Data

(62) Division of application No. 09/282,842, filed on Mar. 31, 1999, now Pat. No. 6,198,634.

(51) Int. Cl.[7] ............................. H05K 1/14; H05K 1/03; H05K 1/09

(52) U.S. Cl. ........................ 174/262; 174/263; 361/767; 361/768; 361/784; 361/795; 361/803

(58) Field of Search .................................. 361/743, 749, 361/750, 751, 767, 768, 770, 771, 784, 792, 795, 803, 804; 174/255, 266, 262–264, 265; 428/209, 901; 228/179.1, 180.1, 180.21, 180.22; 29/830, 843, 845, 852, 853; 427/97, 98; 257/698, 772

(56) References Cited

U.S. PATENT DOCUMENTS

| | | | | |
|---|---|---|---|---|
| 4,788,766 A | * | 12/1988 | Burger et al. | 29/830 |
| 4,803,450 A | * | 2/1989 | Burgess et al. | 333/238 |
| 5,132,879 A | * | 7/1992 | Chang et al. | 361/784 |
| 5,876,842 A | * | 3/1999 | Duffy et al. | 428/209 |
| 6,013,876 A | * | 1/2000 | Caporizzo | 174/262 |
| 6,163,957 A | * | 12/2000 | Jiang et al. | 29/852 |

* cited by examiner

Primary Examiner—John B. Vigushin
(74) Attorney, Agent, or Firm—John A. Jordan; Arthur J. Samodovitz

(57) ABSTRACT

An electronic package which includes first and second circuitized substrates secured together by a solder member which includes a first contact portion for attachment to a printed circuit board and a second contact portion used to bond the two substrates together (e.g., to form a multi-chip module). Semiconductor chips can be positioned on and electrically coupled to the formed solder members.

5 Claims, 6 Drawing Sheets

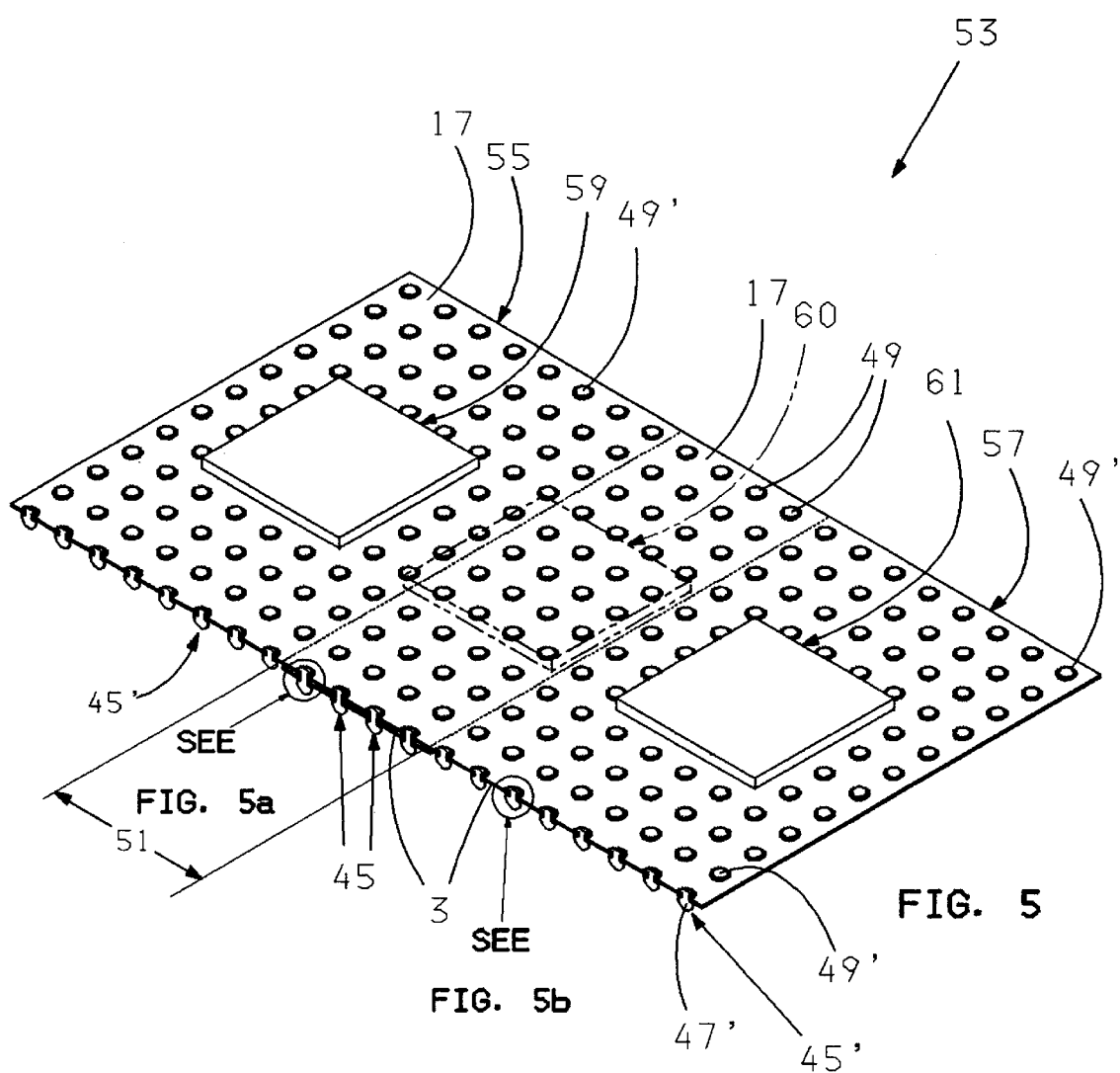
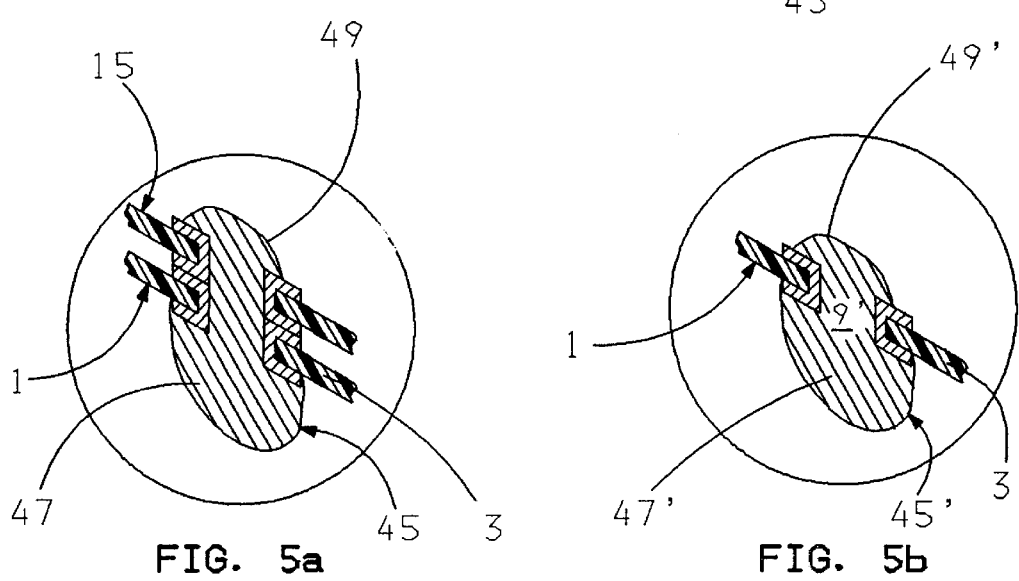

ELECTRONIC PACKAGE WITH STACKED CONNECTIONS AND METHOD FOR MAKING SAME

CROSS REFERENCE TO COPENDING APPLICATION

This application is a divisional application of Ser. No. 09/282,842, filed Mar. 31, 1999, now U.S. Pat. No. 6,198,634.

TECHNICAL FIELD

The invention relates to electronic packages and more particularly to such packages which utilize circuitized substrates and semiconductor devices (chips) as part thereof. Even more particularly, the invention relates to such electronic packages for use in the information handling (computer) field.

BACKGROUND OF THE INVENTION

Thin film electronic packaging structures are known in the art including, for example, those shown and described in U.S. Pat. No. 4,849,856 (Funari et al), U.S. Pat. No. 4,914,551 (Anschel et al), U.S. Pat. No. 4,962,416 (Jones et al) and U.S. Pat. No. 4,965,700 (McBride). See also U.S. Pat. No. 5,057,969 (Ameen et al), U.S. Pat. No. 5,115,964 (Ameen et al), U.S. Pat. No. 5,133,495 (Angulas et al) and, U.S. Pat. No. 5,203,075 (Angulas et al) for related structures. Such packaging structures, as defined in these patents, typically utilize at least one thin film, flexible circuitized substrate as part thereof. Thin film flexible circuitized substrates as produced today possess several distinct advantages (e.g., high density, flexibility, relative ease of manufacture, etc.) desired in the information handling systems. Typically, such circuitized substrates include a thin dielectric (e.g., polyimide) layer having at least one circuit layer thereon. Such thin film, flexible circuitized substrates may be positioned on and electrically coupled to another circuitized substrate (e.g., printed circuit board) to thereby electrically couple a chip, which is connected to respective portions of the thin film circuitized substrate's circuitry, to corresponding circuitry on the printed circuit board. The aforementioned U.S. Pat. Nos. 4,849,856, 4,914,551, 4,962,416 and 5,057,969 illustrate representative examples of such packaging structures which utilize this means of connection.

In U.S. Pat. No. 5,561,323 (Andros et al), there is described a substrate including at least one solder element which is positioned in electrical contact with a plated through hole (PTH). The solder element is bonded to the PTH by solder reflow forming a solder connection wherein the solder ball is aligned with the PTH and the PTH is brought in physical contact therewith, following which heat is applied to cause at least partial melting of the solder ball and capillary movement or the like of such solder through the respective openings. It is possible to provide solder elements for each of several PTHs in the substrate where each of the solder elements is bonded to the respective PTH by the solder reflow operation described to form a pattern of solder connections to thereby electrically couple a chip thereon.

As understood from the following, the invention is able to readily utilize such flexible circuitized substrates in combination with a capillary soldering technique to produce a resulting electronic package structure of relatively high density. The invention is also able to be used to produce a number of different (multi-chip module or MCM) structures heretofore unknown in the art.

Multi-chip modules (MCMs) are well known in the art and provide many advantages, including that of allowing individual chips to be located very close to one another, thereby reducing chip-to-chip interconnection links. A multi-chip module is comprised of a chip carrier substrate on which various chips are positioned and on which the chip terminals extend out by various means to terminals spaced to suit the spacing and dimension of wires on the next higher level of package (i.e., card or board). The multi-chip module will usually contain multilevel wiring planes and power planes interconnecting several of its chips. The multi-chip package is capable of supporting several chips on a single package, where the chip carrier substrate can be a material such as a ceramic, silicon, or a laminate such as a common printed circuit board laminate material. Such materials include polyimide, glass epoxy or polytetrafluoroethylene.

Manufacture of such multi-level chip carrier substrates using conventional techniques has a number of disadvantages. Conventional multi-level substrate processing frequently comprises a sequential process in which one circuit is laid down upon and formed over an earlier formed circuit with suitable dielectric layers to isolate the several circuit layers from one another. Such substrates may employ many layers, each of which, excepting only the last, effectively forms a base upon which the next layer is constructed. The multi level substrate, therefore, can be effectively tested only after completion of all of its layers. This may be expensive because many layers of a module made without defects may have to be discarded if a final layer is found to be faulty, or one may continue to add value to a faulty product.

As defined herein, the electronic package of the present invention represents a compact structure with two flexible circuitized substrates electrically coupled together by a solder member. The structure can serve as a single chip carrier which can be electrically coupled to a circuit board to allow communication of the chip to the outside environment through the circuit board. The invention can also be adapted for use as part of a high circuit density multi-chip module. Furthermore, the package as defined herein is capable of providing high power dissipation and excellent electrical performance in a structure that can be assembled in a relatively facile and inexpensive manner. Additionally, the electronic package of the present invention substantially reduces waste in manufacture because individual circuitized substrates used in the multi-chip module manufacture can be individually tested prior to assembly. Even further, the structure as defined herein is adapted for accepting a variety of different chip configurations and associated circuitized substrate structures, thus providing a much desired versatility for such a package.

It is believed that an electronic package possessing the features mentioned above, and others discernable in the teachings provided herein, represents a significant advancement in the electronic packaging field. It is also believed that a new and unique method for making such a package would constitute a significant contribution to this field.

OBJECTS AND SUMMARY OF THE INVENTION

It is, therefore, a primary object of the invention to enhance the art of electronic packaging by providing an electronic package possessing the several advantageous features defined herein.

It is another object of the invention to provide a method of making such an electronic package.

In accordance with one aspect of the invention, there is defined an electronic package which comprises a first circuitized substrate having an external surface and at least one conductive aperture. The electronic package also includes a second circuitized substrate having at least one conductive aperture therein and an external surface. The first and second circuitized substrates are aligned such that the at least one conductive aperture of the first circuitized substrate is substantially aligned with the at least one conductive aperture of the second circuitized substrate. The electronic package further includes at least one solder member having a first contact portion extending from the external surface of the first circuitized substrate and a second contact portion extending substantially within both of the aligned conductive apertures of the first and second circuitized substrates to secure the circuitized substrates together.

In accordance with another aspect of the invention, there is defined a method of making an electronic package wherein the method comprises the steps of providing a first circuitized substrate having an external surface and at least one conductive aperture therein, the at least one conductive aperture in contact with the external surface and providing a second circuitized substrate having at least one conductive aperture therein and also having an external surface. The next step comprises aligning the circuitized substrates such that the at least one conductive aperture of the first circuitized substrate is substantially aligned with the at least one conductive aperture of the second circuitized substrate. The next step comprises forming at least one solder member including a first contact portion extending from the external surface of the first circuitized substrate and a second contact portion extending substantially within both of the aligned conductive apertures of the first and second circuitized substrates, the solder member securing the substrates together.

BRIEF DESCRIPTION OF THE DRAWINGS

FIG. 4 illustrates a partial side view of the electronic package of the invention.

FIG. 5 illustrates a multi-chip module utilizing the structure of FIG. 4 to connect two electronic packages of the invention together.

BEST MODE FOR CARRYING OUT THE INVENTION

For a better understanding of the invention together with other and further objects, advantages and capabilities thereof, reference is made to the following disclosure and appended claims in connection with the above described drawings.

Figure 1:
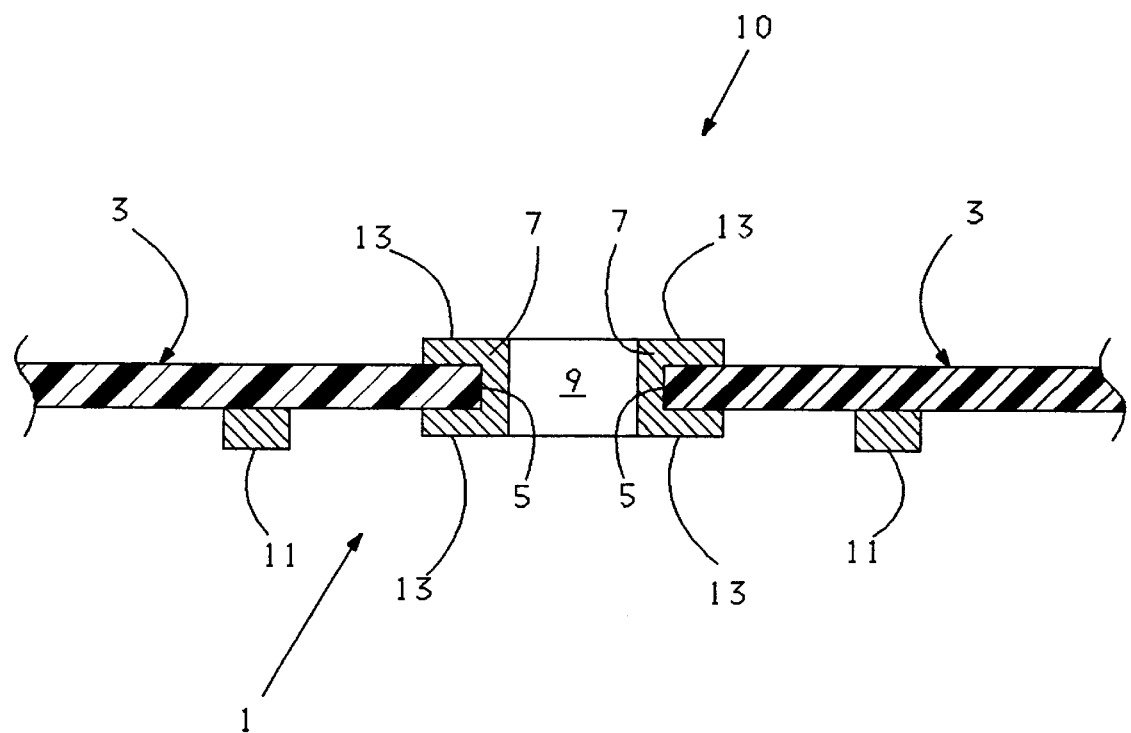
FIGS. 1–4 illustrate the method of making the electronic package of the invention, and furthermore

In FIG. 1, there is shown a partial side view of a first circuitized substrate 1 of electronic package 10. First circuitized substrate 1 includes a dielectric layer 3 and an opening 5, opening 5 having a conductive layer 7 thereon. Conductive layer 7 forms the inner walls of the at least one conductive aperture 9 in dielectric layer 3. First circuitized substrate 1 may further include separate conductive elements such as conductors 11. In this embodiment of the invention conductive aperture 9 is shown as a PTH, which further includes an external surface 13.

Figure 2:
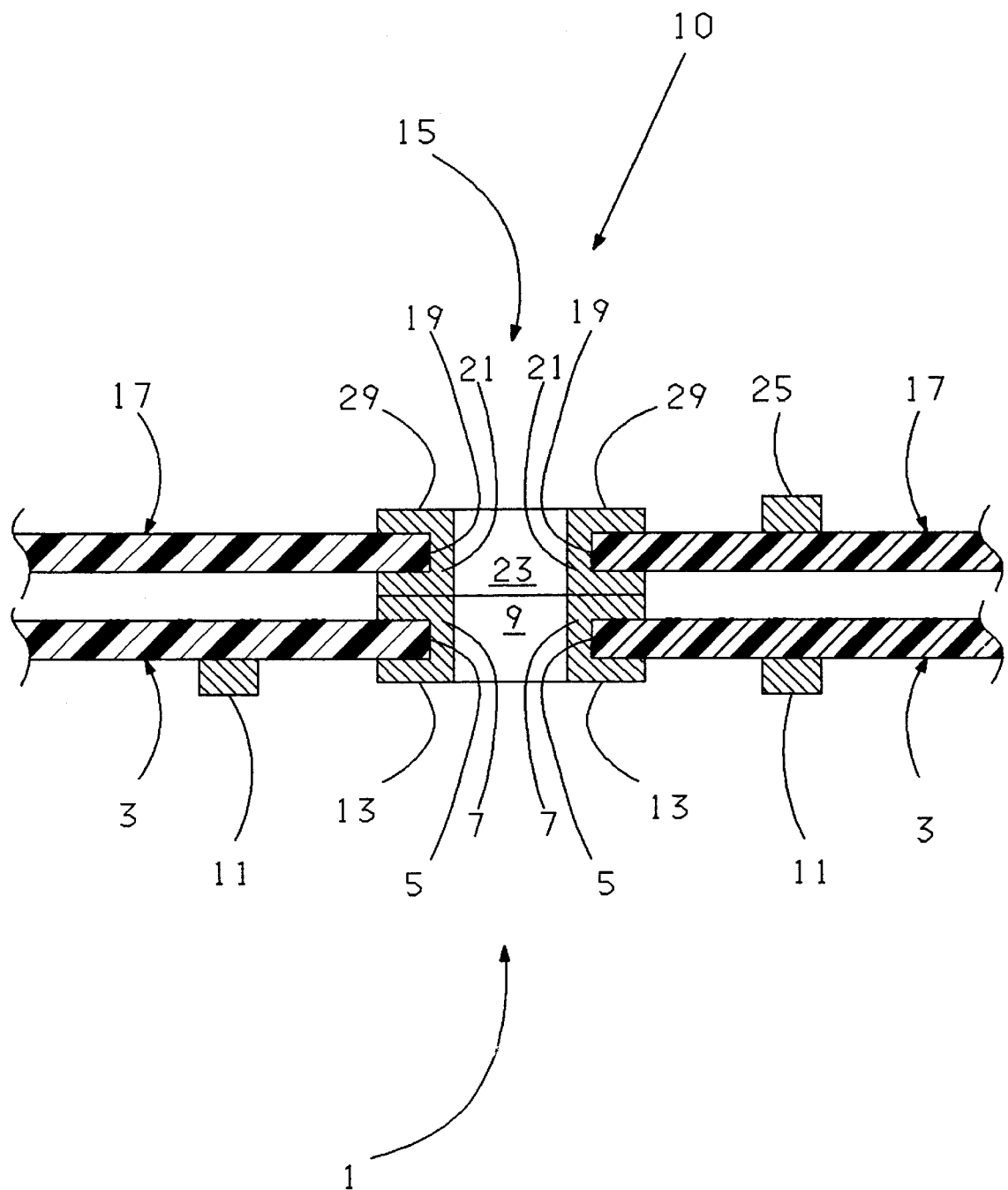

In FIG. 2, there is shown a partial side view of the first circuitized substrate 1 as shown in FIG. 1 with a second circuitized substrate 15 positioned on the first circuitized substrate 1. The second circuitized substrate 15 includes dielectric layer 17 and opening 19, opening 19 having a conductive layer 21 thereon. Conductive layer 21 forms the inner walls of at least one conductive aperture 23 and circuitization layer 25 on dielectric layer 17. Conductive aperture 23 is also shown as a PTH. The conductive aperture of second circuitized substrate 17 further includes an external surface 29.

The dielectric layers of first circuitized substrate 1 and second circuitized substrate 15 are comprised of at least one layer of a material such as polyimide, polytetrafluoroethylene, or known epoxy-glass. The preferred material is polyimide. The substrates 1 and 15 can be combinations of these materials and can be flexible depending on the thickness and amounts of conductive layers 7 and 21 and conductors 11 and 25. Conductive layers 7 and 21 and conductors 11 and 25 are comprised of a metallic material such as copper, nickel, gold, chromium, solder, alloys of solder or combinations of these metals. Conductive layers 7 and 21 and conductors 11 and 25 can also have a protective layer (not shown) thereon, to protect the metallic material during storage. When conductive layers 7 and 21 are comprised of copper, the protective layer is usually a layer of benzotriazole, chlorite, or immersion tin. Benzotriazole is an organic compound which binds to the copper protecting it from oxidation under high humidity and temperature conditions. Immersion tin is a very thin layer (about 30 microinches) of tin which displaces a small amount of copper on the surface of the conductive layer. Chlorite is a copper oxide adhesion promoter which is formed by contacting the copper surface of the conductive layers with a hot caustic solution (sodium or potassium hydroxide). FIG. 2 also illustrates that conductive apertures 9 and 23 are aligned such that the inner walls, when taken together, form substantially a single continuous aperture through both substrates. This continuous aperture forms a conductive wall for the subsequent formation of a solder member which will be explained in more detail later.

Figure 3:
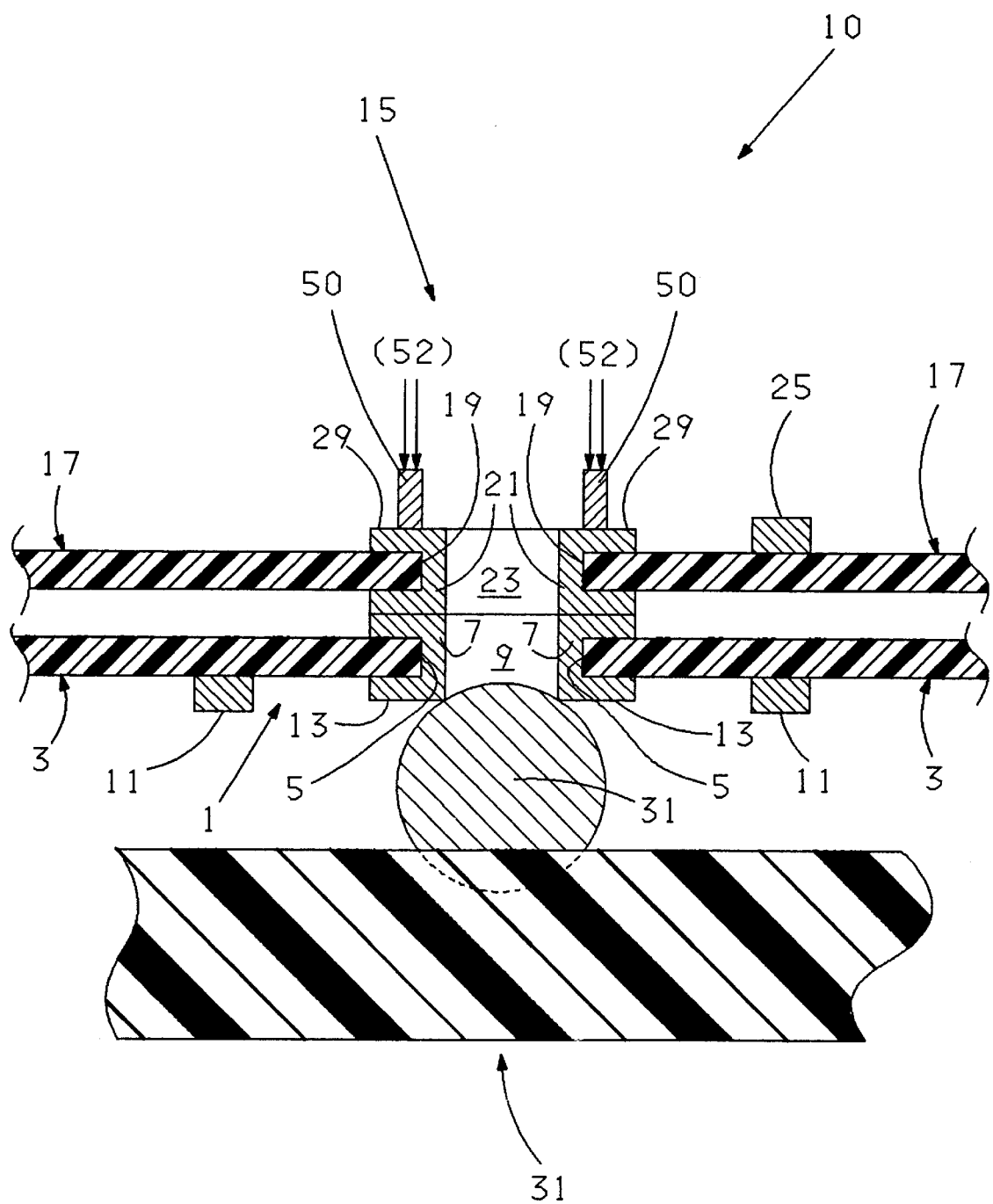

In FIG. 3, the aligned first and second circuitized substrates are shown with a solder member 31 provided on the external surface 13 of PTH 9 of the first circuitized substrate 1. Solder member 31 is shown to be in substantial contact with the at least one conductive aperture 9 of the first circuitized substrate. Solder member 31 is positioned in contact with external surface 13 of the PTH 9 by means of a nested holder 33 under solder member 31, to maintain the solder portion in contact with external surface 13.

Figure 4:
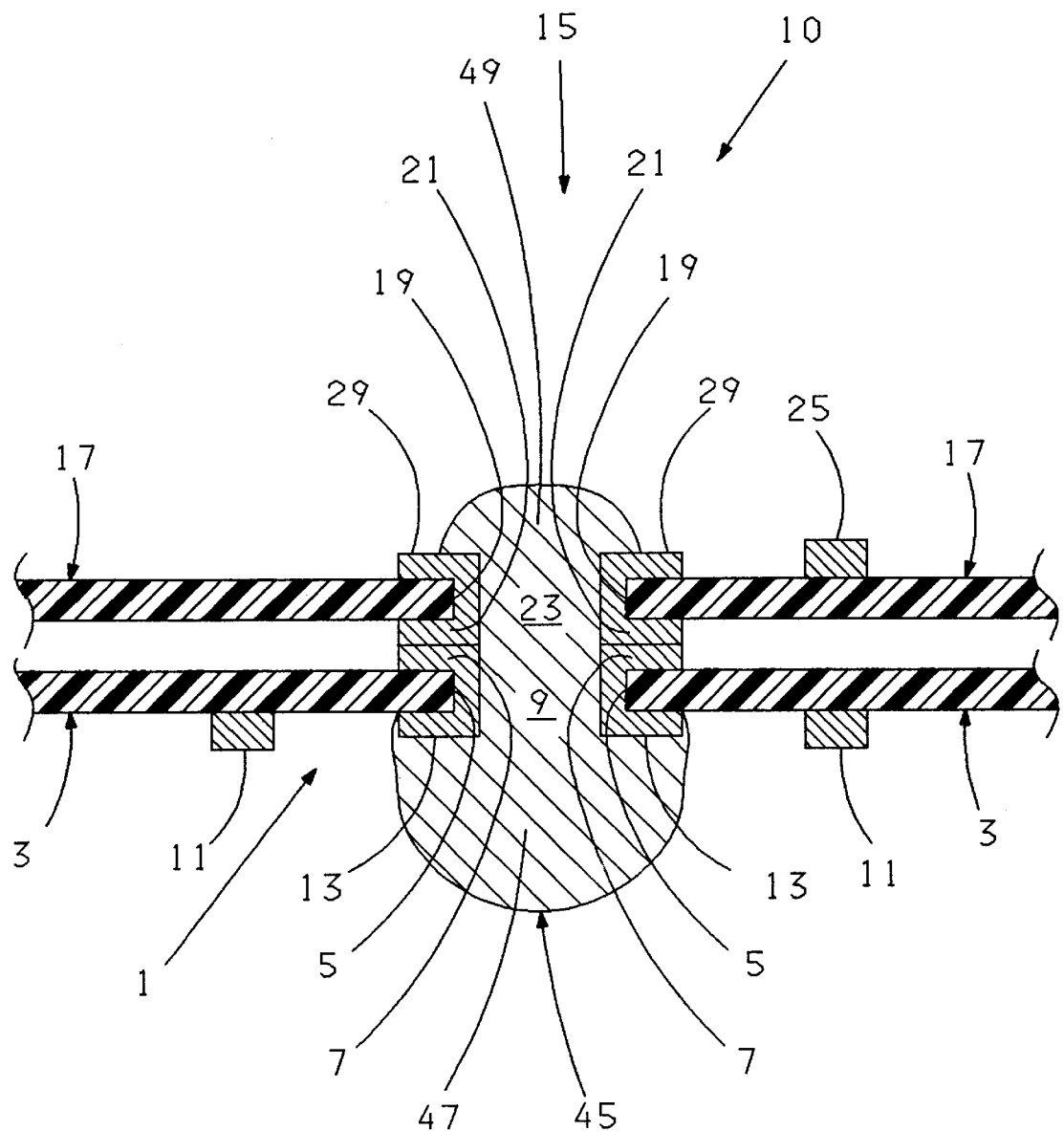

In FIG. 4, there is shown a partial side view of an electronic package 10 in accordance with one aspect of the invention. FIG. 4 illustrates the first and second circuitized substrates, 1 and 15 respectively, with conductive apertures 9 and 23 aligned such that the inner walls, when taken together, form substantially a single continuous aperture through both substrates. This continuous aperture forms a conductive wall for at least one solder member 45 which includes a first contact portion 47 which extends from external surface 13 and a second contact portion 49 which extends at least substantially within both aligned conductive apertures 9 and 23 to substantially secure the circuitized substrates together. The solder member 45 is comprised of a high melt solder alloy having a melting point greater than about 183 degrees Celsius (° C.). The preferred high melt solder alloy which comprises solder member 45 is a solder including tin, lead, gold, silver, antimony or combinations thereof. An even more preferable solder alloy comprises about 90% lead and about 10% tin. Other high melt solder alloys are well known in the art and no further explanation is believed necessary. As shown in FIG. 4, the cross sectional configuration of the first contact portion 47 of solder member 45 is substantially round although other cross sectional shapes can be possible, such as oval or elliptic. First contact portion 47 must be suitable to provide a standoff from a printed circuit board (PCB) to which it will be assembled. The second contact portion 49 of solder member 45 extends substantially within both of the aligned conductive apertures 9 and 23 and can extend to the external surface 29 of the upper aperture and preferably is in the shape of a dome on the external surface 29, extending substantially over and around the plated opening of conductive aperture 23 of the second circuitized substrate. When the second contact portion is in the shape of a dome on external surface 29, it forms a hemispherical shaped member atop the conductive aperture 23. Second contact portion 49 of solder member 45 serves to assist in securing the circuitized substrates together. The formed dome can serve as one contact point for at least one bump of a chip attached to the external surface 29 of the second circuitized substrate. Second contact portion 49, when formed as a dome, can also be one of several similar solder members on the surface of the second circuitized substrate, serving as an array of contact points for an array of chip contact bumps. This structure may form a chip carrier that can subsequently be mounted on a PCB or printed wiring board (PWB) with a plurality of first contact portions 47 utilized for the attachment. It is understood that in addition at a two layer structure as illustrated and described, multiple structures as shown in FIG. 4 can be stacked one atop the other with the first contact portion 47 of the electronic package being attached to the second contact portion of another electronic package of the type shown in FIG. 4, yielding a package with more than two layers. It is further understood that single circuitized substrates such as those illustrated in FIG. 1 can be stacked atop the structure of FIG. 4 to provide even more layers for the finished product.

The structure illustrated in FIG. 4 is formed by bringing heating element 50 (FIG. 3) in contact with external surface 29 of the upper aperture 23. Heating element 50 may be comprised of molybdenum or titanium but is not limited to these metals. Any metal or alloy that can withstand a temperature of about 600° C. without forming an intermetallic bond with tin or lead can be used. A specified force of about 115 grams or less is applied by heated member 50 to external surface 29 of the upper aperture 23. This force is depicted by arrows 52 in FIG. 3 and serves to keep first circuitized substrate 1, second circuitized substrate 15 and solder member 31 in intimate contact. Next, an energy pulse of about 50 watts is applied to heated member 50 in contact with circuitized external surface 29 of the upper aperture, thereby melting the solder member 31. When solder member 31 melts, some of the melted solder in contact with external surface 13 wicks through aligned conductive apertures 9 and 23 to form a first contact portion 47 and a second contact portion 49 thereby securing circuitized substrates 1 and 15 together.

Heated element 50 can be removed from external surface 29 as soon as the second contact portion 49 extends substantially within both of the aligned conductive apertures of the first and second circuitized substrates. It can also be left in place until contact portion 49 reaches external surface 29 of the second circuitized substrate; preferably, it can be left in place long enough for the second contact portion to wick up above external surface 29 such that the second contact portion is formed in substantially the shape of a dome on external surface 29 of the second circuitized substrate 15, as shown in FIG. 4.

The invention of FIG. 4 can serve as an interposer as illustrated in FIG. 5 wherein a plurality of solder members 45 serve to connect two portions of circuitized substrates 1 and 15 in region 51 to form a multi-chip module 53 from two single chip modules 55 and 57 that include chips 59 and 61, respectively. FIG. 5A is an enlarged view, showing one of the substrate couplings formed in accordance with the teachings herein. A partial cross sectional view of single chip module 57 is illustrated in FIG. 5B, including circuitized substrate 1, dielectric layer 3, solder member 45', first contact portion 47' and second contact portion 49'. An array of contact bumps (solder balls not shown) on the bottom surface of chip 61 is attached to an array of second contact portions 49' on the single chip module 57. Single chip module 55 preferably includes a similar structure. This multilayer structure is highly desirable because it allows a manufacturer to separately build and test single chip modules 55 and 57 before these are assembled into the structure illustrated in FIG. 5. This avoids the previously known manufacturing problem and associated yield loss discussed earlier where a sequential buildup technique is used to manufacture multi-chip modules. When using the sequential buildup technique for manufacturing, testing of the multi-chip module cannot be performed until after the multi-chip module is built. This is true because circuitization (including hole metallization) is typically performed after buildup of each substrate individually. Circuitization or hole metallization defects on any layer manufactured sequentially can lead to rejection of the entire assembly.

It can be easily understood that the multi-chip module of FIG. 5 can be expanded to yield multi-chip modules with more than two chips using the structures of FIGS. 4 and 5. First contact portions 45 and 45' are utilized as the attachment locations between the module and a host PCB, and as a standoff from the PCB after attachment.

Figure 6:
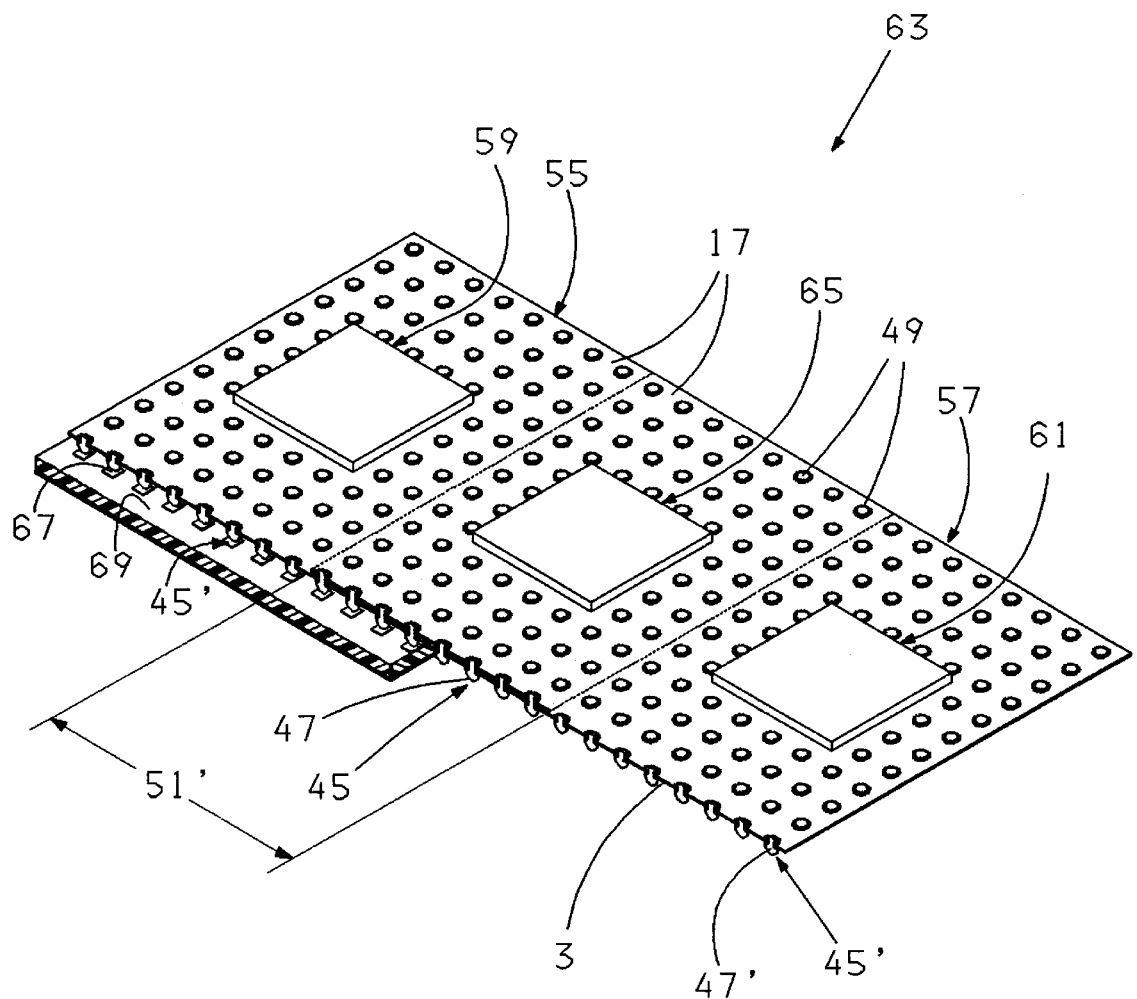
FIG. 6 illustrates another type of multi-chip module utilizing the attributes of the structure of FIG. 4 to connect two electronic packages of the invention together and to stack at least one chip in the connecting area.

It is also possible to mount one or more third chips 60 (one shown in phantom in FIG. 5) within the common region 51. FIG. 6 represents another example of such a structure, albeit providing greater overlap of the two modules 55 and 57. Third chip 65 is substantially centrally positioned on the larger overlapping region 51'. The structure in FIGS. 5 and 6 is thus shown as taking advantage of the unique structure of the invention to act as both an interposer securing circuitized substrates together as well as second contact portions 49 acting as attachment points for chip 65, yielding a multi-chip module 63 with three chips. First contact portions 47 and 47' of solder members 45 and 45', respectively, can be utilized for attachment of multi-chip module 63 (and module 53) to pads 67 of PCB 69. It can be easily understood that more circuitized substrates can be added to the multi-chip module of FIG. 6, thereby yielding multi-chip modules with more than three chips using the structures illustrated and described in FIGS. 4–6.

Thus, there have been shown and described an electronic package and method of making same wherein the package can easily accommodate single chip or multi-chip bonding in a unique manner. The package is easily testable prior to its assembly into a multi-chip module, thus minimizing yield loss and simplifying manufacturability. As an assembled module, with chip attached, it has first contact portions extending from one of its external surfaces for bonding to a PCB. Still further, the package can be stacked beyond two layers, allowing it to have multiple signal, power or ground capability.

While there has been shown and described what are at present considered the preferred embodiments of the invention it will be obvious to those skilled in the art that various modifications and changes may be made therein without departing from the scope of the invention as defined by the appended claims.

What is claimed is:

1. An electronic package comprising:

a first circuitized substrate having at least one conductive aperture therein having an external surface;

a second circuitized substrate having at least one conductive aperture therein having an external surface, said first and second circuitized substrates aligned such that said at least one conductive aperture of said first circuitized substrate is substantially aligned with said at least one conductive aperture of said second circuitized substrate, said at least one conductive aperture of said first circuitized substrate and said at least one conductive aperture of said second circuitized substrate including a conductive metallic layer thereon selected from the group consisting of copper, nickel, gold, chromium, solder and alloys thereof; and at least one high melt solder alloy member having a melting point greater than about 183° Celsius with said solder member including a first contact portion extending from said external surface of said conductive aperture of said first circuitized substrate, said first contact portion including a cross-sectional configuration that is substantially round, oval or ellipsoidal, and a second contact portion extending substantially within both of said aligned conductive apertures of said first and second circuitized substrates to at least said external surface of said conductive aperture of said second circuitized substrate to secure said circuitized substrates together.

2. The electronic package of claim 1 wherein said conductive metallic layer is copper including a protective layer thereon, said protective layer selected from the group consisting of benzotriazole, chlorite, and immersion tin.

3. The electronic package of claim 1 wherein said high melt solder alloy member is comprised of metallic material, said metallic material is selected from the group consisting of tin, lead, gold, silver, antimony, and combinations thereof.

4. An electronic package comprising:

a first circuitized substrate having at least one conductive aperture therein having an external surface, said first circuitized substrate comprised of material selected from the group consisting of polyimide, polytetrafluoroethylene and epoxy glass cloth;

a second circuitized substrate having at least one conductive aperture therein having an external surface, said second circuitized substrate comprised of material selected from the group consisting of polyimide, polytetrafluoroethylene and epoxy glass cloth, said first and second circuitized substrates aligned such that said at least one conductive aperture of said first circuitized substrate is substantially aligned with said at least one conductive aperture of said second circuitized substrate, said at least one conductive aperture of said first circuitized substrate and said at least one conductive aperture of said second circuitized substrate including a conductive metallic layer thereon selected from the group consisting of copper, nickel, gold, chromium, solder and alloys thereof; and at least one solder member including a first contact portion extending from said external surface of said conductive aperture of said first circuitized substrate, said first contact portion including a cross-sectional configuration that is substantially round, oval or ellipsoidal, and a second contact portion extending substantially within both of said aligned conductive apertures of said first and second circuitized substrates to at least said external surface of said conductive aperture of said second circuitized substrate to secure said circuitized substrates together.

5. An electronic package comprising:

a first circuitized substrate having at least one conductive aperture therein having an external surface;

a second circuitized substrate having at least one conductive aperture therein having an external surface, said first and second circuitized substrates aligned such that said at least one conductive aperture of said first circuitized substrate is substantially aligned with said at least one conductive aperture of said second circuitized substrate, said at least one conductive aperture of said first circuitized substrate and said at least one conductive aperture of said second circuitized substrate including a conductive metallic layer thereon selected from the group consisting of copper, nickel, gold, chromium, solder and alloys thereof; and at least one solder member including a first contact portion extending from said external surface of said conductive aperture of said first circuitized substrate to form a connection to a printed circuit board, said first contact portion including a cross-sectional configuration that is substantially round, oval or ellipsoidal, and a second contact portion extending substantially within both of said aligned conductive apertures of said first and second circuitized substrates to at least said external surface of said conductive aperture of said second circuitized substrate to secure said circuitized substrates together.

* * * * *